(12) United States Patent
Dodoc et al.

(10) Patent No.: US 7,957,069 B2
(45) Date of Patent: Jun. 7, 2011

(54) PROJECTION OPTICAL SYSTEM

(75) Inventors: Aurelian Dodoc, Oberkochen (DE); Wilhelm Ulrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 549 days.

(21) Appl. No.: 11/793,678

(22) PCT Filed: Dec. 30, 2005

(86) PCT No.: PCT/EP2005/014148
§ 371 (c)(1),
(2), (4) Date: Jun. 22, 2007

(87) PCT Pub. No.: WO2006/069795
PCT Pub. Date: Jul. 6, 2006

(65) Prior Publication Data
US 2007/0268594 A1 Nov. 22, 2007

Related U.S. Application Data

(60) Provisional application No. 60/640,087, filed on Dec. 30, 2004.

(51) Int. Cl.
*G02B 3/00* (2006.01)
*G02B 9/00* (2006.01)
*G02B 9/34* (2006.01)
*G02B 13/18* (2006.01)
*G02B 3/02* (2006.01)

(52) U.S. Cl. .......................... 359/650; 359/781; 359/717

(58) Field of Classification Search .................. 359/649, 359/650, 686, 691, 715, 717, 781, 753, 793
See application file for complete search history.

(56) References Cited

U.S. PATENT DOCUMENTS

| | | | |
|---|---|---|---|
| 5,229,872 | A | 7/1993 | Mumola |
| 5,296,891 | A | 3/1994 | Vogt et al. |
| 5,523,193 | A | 6/1996 | Nelson |
| 5,808,814 | A | 9/1998 | Kudo |
| 5,831,776 | A | 11/1998 | Sasaya et al. |
| 6,445,510 | B1 | 9/2002 | Schuster et al. |
| 6,459,534 | B1 | 10/2002 | Kato et al. |

(Continued)

FOREIGN PATENT DOCUMENTS

EP 1 235 092 8/2002

(Continued)

OTHER PUBLICATIONS

International Search Report issued Jun. 13, 2006 in corresponding international patent application No. PCT/EP2005/014148.

(Continued)

*Primary Examiner* — Alicia M Harrington
(74) *Attorney, Agent, or Firm* — Fish & Richardson P.C.

(57) ABSTRACT

A projection optical system comprises a plurality of lenses disposed along an optical axis of the projection optical system; wherein the plurality of lenses is dividable into four non-overlapping groups of lenses, such that a total refractive power of each group of lenses is one of a negative refractive power and a positive refractive power; and wherein a refractive power of each lens of the fourth group of lenses is equal to or greater than 0. A lens of the third group of lenses which is disposed directly adjacent to a lens of the fourth group of lenses may have a concave surface facing towards the second object.

77 Claims, 3 Drawing Sheets

U.S. PATENT DOCUMENTS

| | | | |
|---|---|---|---|
| 2001/0024330 A1 | 9/2001 | Hashimoto et al. | |
| 2002/0122164 A1 | 9/2002 | Schuster et al. | |
| 2002/0186355 A1 | 12/2002 | Omura | |
| 2003/0030916 A1 | 2/2003 | Suenaga | |
| 2003/0137733 A1 | 7/2003 | Gerhard | |
| 2003/0147061 A1 | 8/2003 | Omura | |
| 2003/0174408 A1 | 9/2003 | Rostalski et al. | |
| 2004/0027653 A1 | 2/2004 | Shafer et al. | |
| 2005/0231813 A1 | 10/2005 | Rostalski et al. | |
| 2006/0087633 A1* | 4/2006 | Omura et al. | 355/53 |
| 2007/0258152 A1 | 11/2007 | Rostalski et al. | |
| 2008/0043345 A1 | 2/2008 | Dodoc et al. | |

FOREIGN PATENT DOCUMENTS

| | | |
|---|---|---|
| EP | 1 245 984 | 10/2002 |
| EP | 1 622 191 | 2/2006 |
| WO | WO 03/075096 | 9/2003 |
| WO | WO 2004/097911 | 11/2004 |
| WO | WO 2005/050321 | 6/2005 |

OTHER PUBLICATIONS

Fischer et al., *Optical System Design*, "Chapter 7, Guidelines in the Use of Aspheric Surfaces," McGraw-Hill, pp. 124-128, 2000.

Norland, "Defining and Measuring Physical Parameters of PC Polished Fiber Optic Connectors," https://www.norlandprod.com/literature/Single%20Fiber%20Connectors.pdf, pp. 1-8, Rev. 12/00, 2000.

International Standard ISO 10110-5:1996(E), pp. 7 and 9, 1996.

* cited by examiner

PROJECTION OPTICAL SYSTEM

CROSS REFERENCE TO RELATED APPLICATIONS

This application is a National Stage application of International Application No. PCT/EP2005/014148, filed Dec. 30, 2005, which designates the United States and was published in English, and which claims the benefit of U.S. Provisional Application No. 60/640,087, filed Dec. 30, 2004. These applications, in their entirety, are incorporated herein by reference.

BACKGROUND OF THE INVENTION

1. Field of the Invention

The present invention relates to a projection optical system.

2. Brief Description of Related Art

Lithographic processes are commonly used in the manufacture of semiconductor elements, such as integrated circuits (ICs), LSIs, liquid crystal elements, micropatterned members and micromechanical components.

A projection exposure apparatus used for photolithography generally comprises an illumination optical system having a light source and a projection optical system. Light from the illumination optical system illuminates a reticle (a first object) having a given pattern, and the projection optical system transfers an image of the reticle pattern, onto a region of a photo-sensitive substrate (a second object). The image of the reticle pattern may also be reduced in size by the projection optical system so as to produce a smaller image of the reticle pattern on the substrate.

The trend to ever smaller and more sophisticated miniaturized devices places increasingly high demands on the projection exposure systems and thus projection optical systems used for the manufacture of these devices. In order to achieve higher resolutions in the exposure of substrates, the imaging of the reticle onto the substrate has to be performed with a sufficiently high numerical aperture (NA) on the side of the substrate. Therefore, an increase of the numerical aperture is a decisive factor in the development of improved projection exposure systems.

High numerical apertures bring about a whole range of challenges in terms of a design of a projection optical system. In purely refractive optical systems for projection exposure the requirements for correction of imaging errors such as aberrations and the like are increasing with increasing numerical aperture. Projection optical systems tend to increase in weight and size as the numerical aperture of such systems increases. In particular, diameters of lenses increase to such an extent that they become very expensive and difficult to manufacture, and the manufacture of aspherical lenses of a sufficient accuracy represents a particular problem.

SUMMARY OF THE INVENTION

In view of the above, it is an object of the present invention to provide a projection optical system having a high imaging performance.

It is a further object of the present invention to provide a projection optical system wherein diameters of lenses used in the projection optical system can be maintained within an acceptable range.

In order to achieve the above objects, the present invention, according to one aspect, provides a projection optical system for imaging a first object into a region of a second object, which projection optical system comprises: a plurality of lenses disposed along an optical axis of the projection optical system; wherein the plurality of lenses is dividable into a plurality of non-overlapping groups of lenses, such that a total refractive power of each group of lenses is one of a negative refractive power and a positive refractive power, wherein a first group of lenses has a negative refractive power, wherein a second group disposed directly adjacent to the first group has a positive refractive power, wherein a third group disposed directly adjacent to the second group has a negative refractive power, wherein a fourth group disposed directly adjacent to the third group has a positive refractive power, wherein the fourth group of lenses is that group of lenses among all groups of lenses that is disposed closest to the second object, and wherein a refractive power of each lens of the fourth group of lenses is equal to or greater than 0.

Preferably, the grouping of the lenses into the first, second, third and fourth group is selected such that the total refractive power of each of the first, second, third and fourth group is a maximum value. In a particular embodiment herein, the groups are selected such that a sum of the absolute values of the total refractive powers of the groups is a maximum value.

The inventors have found it to be advantageous to make use of negative lenses mainly at the very front and in the waist of the projection optical system. The fourth group of lenses, which is directly adjacent to the third group of lenses and thus the waist, does not contain any lenses of negative refractive power. This arrangement results in lenses having negative refractive power being present in regions of the projection optical system where a distance between a periphery of the imaging beam and the optical axis is comparatively small, which, in turn, allows use of lenses having a relatively small effective diameter. The arrangement further enables a sufficiently flat image of the first object in a region of the second object.

According to an embodiment of the invention, the projection optical system is configured such that a lens of the third group of lenses which is disposed directly adjacent to a lens of the fourth group of lenses has a concave surface facing towards the second object.

According to an embodiment of the invention, the projection optical system is configured such that a diameter of a bundle of imaging rays (or imaging beam, respectively) imaging a first location on the optical axis disposed in a region of the first object into a second location on the optical axis disposed in a region of the second object has a minimum cross section at a third location on the optical axis disposed within the third lens group, and wherein only one pair of two adjacent lenses disposed between the third location and the second location have refractive powers which are chosen such that a product of the refractive powers of the two adjacent lenses is a negative value.

According to an embodiment herein, the projection optical system comprises an aperture stop which is disposed at a fourth location on the optical axis, and the one pair of lenses is disposed between the third location and the fourth location.

Out of the lenses having a refractive power of equal to or greater than 0, one lens has an effective diameter greater than an effective diameter of any other lens having a refractive power of greater than or equal to 0, i.e. a largest effective diameter. Preferably, said largest effective diameter is by a factor of between 1.1 and 2.5 greater than any effective diameter of any lens having a negative refractive power. In exemplary embodiments, the factor may in a range from 1.1 to 2.0, or for instance greater than 1.3 or 1.5.

According to an embodiment of the invention, an effective diameter of any lens having a negative refractive power in the projection optical system is less than L/5.

The term L as used in this application stands for the length of the projection optical system represented as a distance between the first object and the second object, in particular in an operating or exposure mode, i.e. a distance as foreseen by the design of the projection optical system when both the first and the second objects are in focus.

In exemplary embodiments, an effective diameter of any lens in a group of lenses having a total negative refractive power is equal to or smaller than an effective diameter of any lens in a group of lenses which has a total positive refractive power and is disposed directly adjacent to the respective group of lenses having a total negative refractive power.

According to a particular embodiment, all lenses of the first and third groups of lenses have a smaller diameter than each of the lenses of the second group of lenses.

Lens, as used herein, relates to a single lens element and not to an optical system comprised of a plurality of lens elements.

A group of lenses, as used herein, may consist of a single lens only or more than one lens.

A refractive power of a lens refers to a refractive power of a lens on the optical axis.

A plane parallel plate, for instance, would have a refractive power of zero in the context of the present invention.

The arrangement of lens groups in the projection optical system as described above typically results in what would generally be referred to as having a single waist. The waist indicates a constriction in lens diameter and hence a decreased distance of imaging rays passing through the respective lenses from an optical axis within the projection optical system. In the above arrangement of groups of lenses, the waist would generally be formed within the region of the third group of lenses.

Preferably, the projection optical system comprises an aperture stop. In exemplary embodiments of the present invention, the aperture stop is disposed within the fourth group of lenses. In those embodiments, the fourth group of lenses may be divided into a first sub-group of lenses that is disposed in between the first object, or more precisely the third group of lenses, and the aperture stop and a second sub-group of lenses in between the aperture stop and the second object.

The aperture stop used in embodiments of the present invention may be adjustable. An example of such an aperture is described in U.S. Pat. No. 6,445,510, filed on Oct. 4, 2000, to the same Assignee, the entire contents of which is incorporated by reference herein.

In exemplary embodiments of the present invention, each lens of the fourth group of lenses has a refractive power of greater than 0, i.e. a positive refractive power.

In preferred embodiments, a refractive power of each lens of the first group of lenses is a negative refractive power. The first group of lenses may comprise at least two lenses.

In exemplary embodiments, a refractive power of each lens of the second group of lenses is greater than or equal to zero, i.e. the second group of lenses does not contain any lenses having a negative refractive power.

The projection optical system according to the present invention comprises embodiments wherein a refractive power of each lens of the third group of lenses is a negative refractive power. The third group of lenses may comprise at least two lenses. For instance, the third group of lenses may consist of three lenses having a negative refractive power.

According to exemplary embodiments of the present invention, the projection optical system comprises one or more lenses having one or two aspherical surfaces.

As used herein, the term "aspherical surface" is to be understood as referring to aspherical surfaces in which a maximum axial distance between the aspherical surface and a best fitting sphere is 2 µm or more. This definition serves to exclude spherical surfaces with unintended deformations as well as aspherical surface parts typically introduced after the manufacture of the lens/projection optical system for correction of aberrations which are generally due to the manufacturing process rather than inherent to the particular design of the projection optical system.

According to an embodiment of the present invention, at least one lens of the fourth group of lenses is highly aspherical and such that an axial distance between the aspherical surface and a best fitting sphere is more than about 1.0 mm. According to particular embodiments herein, the axial distance between the aspherical surface and a best fitting sphere is more than about 1.5 mm or 2.0 mm. Such a highly aspherical surface in the above described position allows embodiments wherein a large part of the correction of the projection optical system for aberrations may be achieved by that particular lens.

According to an embodiment of the present invention, at least two lenses, and in particular three lenses, of the lenses of the third and fourth groups of lenses have at least one aspherical surface, wherein an axial distance between the respective aspherical surface and a best fitting sphere thereof is more than about 1.0 mm.

In those embodiments of the present invention wherein an aperture stop is disposed within the fourth group of lenses, the at least one aspherical lens may be advantageously disposed in between the aperture stop and the second object.

In an exemplary embodiment, the projection optical system has a region extending from the first object along the optical axis towards the second object wherein the following condition is fulfilled:

$$|h_{au}/h_{fc}|<1.2,$$

wherein $h_{au}$ is a distance between the optical axis and a field ray that originates from a point of the first object having a maximum distance from the optical axis, wherein the field ray originates from that point in a direction parallel to the optical axis, and $h_{fc}$ is a distance between the optical axis and an angular ray originating from an axial point of the first object, the angular ray forming a largest possible angle with the optical axis such that the ray contributes to imaging of the first object into the region of the second object, and wherein $h_{au}$ and $h_{fc}$ are measured at a same location on the optical axis. The maximum distance of the field ray indicates that maximum distance, where the field ray still contributes to the imaging of the first object into the region of the second object.

In exemplary embodiments of the present invention said region extends over a distance of at least one third of an overall distance between the first and the second object. The distance to the optical axis refers to a distance from the optical axis as measured orthogonally thereto.

According to a further aspect of the present invention, the region as defined above comprises at least two aspherical surfaces.

The projection optical system according to the present invention comprises embodiments wherein a distance, as measured on the optical axis, between any two directly adjacent lenses of the second group of lenses is smaller than L/100, wherein L is the length of the projection optical system as defined above. In those embodiments, the lenses are disposed very close to one another leaving only very small air gaps, if any, on an optical axis in between lenses.

The projection optical system according to the present invention may also comprise embodiments, wherein at least one distance, as measured on the optical axis, between two directly adjacent lenses of the second group of lenses is greater than L/50, wherein L is the length of the projection optical system as defined above. Thus, in contrast to the embodiment mentioned above, at least two lenses form a rather large (air) gap, as measured on the optical axis, in between them. Directly adjacent, as used herein, means that no additional lens is interposed between the two respective lenses.

According to an embodiment of the present invention, a ratio of a difference between a total length of the fourth group of lenses and a sum of thicknesses of all lenses of the second group of lenses and/or the fourth group of lenses over the total length of the fourth group of lenses is greater than 0.3. According to an embodiment herein, this ratio is greater than 0.5.

In exemplary embodiments of the projection optical system according to the present invention, the fourth group of lenses comprises at least 5 lenses.

For instance, the fourth group of lenses may comprise at least three lenses in between the aperture stop and the second object. Alternatively or additionally, the fourth group of lenses may comprise at least two lenses in between the first object and the aperture stop.

In particular in connection with embodiments of the present invention wherein a relatively large air gap is formed within the second group of lenses, at least one distance between two directly adjacent lenses of the fourth group of lenses may be greater than L/30.

The projection optical system may be configured such that the second object is disposed at a working distance from 2 mm to 6 mm from a lens of the projection optical system that is disposed closest to the second object, when in focus. This distance is generally referred to as a working distance.

The projection optical system my have a numerical aperture on a side of the second object of 0.7 or greater, for instance 0.9 or greater.

In exemplary embodiments of the projection optical system according to the present invention, the imaging beam has a wavelength of shorter than 365 nm, preferably shorter than 350 nm.

According to another aspect, the present invention provides a projection optical system for imaging a first object into a region of a second object, the projection optical system comprising: a plurality of lenses disposed along an optical axis of the projection optical system; wherein the plurality of lenses is dividable into two non-overlapping groups of lenses, wherein a first main group of lenses of the two non-overlapping groups of lenses comprises a lens closest to the first object; wherein a second main group of lenses of the two non-overlapping groups of lenses comprises a lens closest to the second object; wherein the plurality of lenses is divided into the first and second main groups of lenses such that a refractive power of the first main lens group has a maximum negative value; wherein lens surfaces of the first and second main groups of lenses include a plurality of aspherical lens surfaces, and wherein a first aspherical lens surface of the plurality of aspherical lens surfaces is configured such that an axial distance between the aspherical lens surface and a best fitting sphere thereof is more than about 1.0 mm.

The first and second main groups of lenses are referred to as "main" groups of lenses rather than simply groups of lenses in the context of the present invention so as to avoid confusion with the first through fourth groups of lenses described before in connection with the other aspects of the invention. This expression is not intended to indicate an existence of any other groups of lenses.

According to yet another aspect, the present invention provides a projection optical system for imaging a first object into a region of a second object, the projection optical system comprising: a plurality of lenses disposed along an optical axis of the projection optical system; wherein the plurality of lenses is dividable into two non-overlapping groups of lenses, wherein a first main group of lenses of the two non-overlapping groups of lenses comprises a lens closest to the first object; wherein a second main group of lenses of the two non-overlapping groups of lenses comprises a lens closest to the second object; wherein the plurality of lenses is divided into the first and second main groups of lenses such that a refractive power of the first main lens group has a maximum negative value; and wherein a refractive power of each lens of the second main group of lenses is equal to or greater than 0.

According to yet another aspect, the present invention provides a projection optical system for imaging a first object into a region of a second object, the projection optical system comprising: a plurality of lenses disposed along an optical axis of the projection optical system; wherein the plurality of lenses is dividable into two non-overlapping groups of lenses, wherein a first main group of lenses of the two non-overlapping groups of lenses comprises a lens closest to the first object; wherein a second main group of lenses of the two non-overlapping groups of lenses comprises a lens closest to the second object; wherein the plurality of lenses is divided into the first and second main groups of lenses such that a refractive power of the first main lens group has a maximum negative value; and wherein lens surfaces of the first and second main groups of lenses include a plurality of aspherical lens surfaces, and wherein a first aspherical lens surface of the plurality of aspherical lens surfaces has a central portion traversed by an optical axis of the projection optical system and a ring portion disposed outside of the central portion, and wherein a local refractive power of the lens experienced by a light beam traversing the central portion and a local refractive power of the lens experienced by a light beam traversing the ring portion have opposite signs.

According to a further aspect, the present invention provides a projection optical system for imaging a first object into a region of a second object, the projection optical system comprising a plurality of lenses disposed along an optical axis of the projection optical system, wherein the plurality of lenses is dividable into two non-overlapping groups of lenses, wherein a first main group of lenses of the two non-overlapping groups of lenses comprises a lens closest to the first object, wherein a second main group of lenses of the two non-overlapping groups of lenses comprises a lens closest to the second object, wherein the plurality of lenses is divided into the first and second groups of lenses such that a refractive power of the first lens group has a maximum negative value, wherein the plurality of lenses comprises one largest lens having a surface having a largest effective diameter out of all surface of lenses of the plurality of lenses, the one largest lens being contained in either the first or second group of lenses, wherein each meniscus lens which has a surface having an effective diameter that is at least 50% of the largest effective diameter and which is comprised in the either first or second group of lenses containing the largest lens fulfils the following requirement:

$$|r_1| \geqq 140 \text{ mm and } |r_2| \geqq 140 \text{ mm}$$

wherein $r_1$ is a radius of curvature of a first optical surface of the meniscus lens, and $r_2$ is a radius of curvature of a second optical surface of the meniscus lens.

In exemplary embodiments, each meniscus lens which has a surface having an effective diameter that is at least 60% or in another example at least 70% of the largest effective diameter and which is comprised in the either first or second group of lenses containing the largest lens fulfils the requirement.

In a further exemplary embodiment, each meniscus lens comprised in the either first or second group of lenses further fulfils at least one of the following requirements: $|r_1| \geq 220$ mm and $|r_2| \geq 220$ mm, or in another example $|r_1| \geq 300$ mm and $|r_2| \geq 300$ mm.

In a further exemplary embodiment, each meniscus lens comprised in the either first or second group of lenses further fulfils the following requirement:

$$|r_1/r_2| > 1.5,$$

wherein in this formula, $r_1$ indicates the radius of curvature of the concave surface of the meniscus lens. In a further exemplary embodiment, $|r_1/r_2| > 1.8$, or $|r_1/r_2| > 2.5$ or $|r_1/r_2| > 5$ may be fulfilled.

In yet a further embodiment, each meniscus lens comprised in the either first or second group of lenses further has an effective diameter which is less than 90%, or in a further example less than 85%, of the largest effective diameter.

Meniscus lens, as is commonly known, refers to a lens having one convex and one concave optical surface. The curvature, i.e. the inverse of a radius of an optical surface, of the convex surface may be the same or different from the curvature of the concave surface. The difference in these two curvatures will influence the optical power of the meniscus lens. The radii of the two optical surfaces of a meniscus lens as indicated in Tables 1 and 2 have the same sign.

Biconvex or biconcave lenses, as is commonly known, have two surfaces that are either both convex or concave, respectively. In connection with the Tables indicating radii of the optical surfaces as given herein, a biconvex lens therefore has two optical surfaces with radii of opposite signs (+/−). The same applies to biconcave lenses.

A plane-parallel plate, as is commonly known, has two plane (i.e. substantially uncurved), parallel optical surfaces.

According to an exemplary embodiment of the invention, the first main group of lenses is dividable into a plurality of non-overlapping sub-groups of lenses such that a total refractive power of each sub-group of lenses is one of a negative refractive power and a positive refractive power.

According to an exemplary embodiment of the invention, the first main group of lenses is dividable into three non-overlapping sub-groups of lenses, wherein a first sub-group of lenses of the three non-overlapping sub-groups of lenses has a negative refractive power and is disposed closest to the first object, wherein a second sub-group of lenses of the three non-overlapping sub-groups of lenses has a positive refractive power, and wherein a third sub-group of lenses of the three non-overlapping sub-groups of lenses has a negative refractive power.

That is, the first and second main lens groups as set out above may be divided such that the first main group of lenses is divided into three sub-groups of lenses such that the division into main groups of lenses and sub-groups thereof corresponds to the division into the first through fourth groups of lenses as described in connection with previous aspects of the invention. In other words, the first through third sub-groups of the first main lens group would correspond to the first, second and third lens group as outlined before and the first main lens group would correspond to the fourth group of lenses.

In exemplary embodiments of the projection optical system according to the above described aspects, generally one or more features of other aspects in addition or alternatively to one or more features of one or more embodiments described in connection with the same or another aspect may further be used, as far as possible. That is, for instance the criteria applied to meniscus lenses as described above may also be realised in embodiments of other aspects of the present invention and vice versa.

In exemplary embodiments, the projection optical system according to the present invention is a purely refractive projection optical system. In alternative exemplary embodiments of the present invention, the projection optical system is a catadioptric projection optical system.

Purely refractive systems are those optical systems that comprise only optical lenses or lens-arrangements. Catadioptric systems comprise both lenses and mirrors.

The first object to be imaged is generally a patterning structure, whereas the second object would generally be a photosensitive substrate. The term patterning structure as used herein refers broadly to any means suited for endowing an illuminating light beam with a patterned cross-section, an image of which pattern (of the illuminated patterning structure) is projected onto the substrate. The patterning structure may be a mask or a reticle, for example. The term reticle is more generally associated with a mask a reduced image of which is projected onto the substrate, and the term mask generally refers to a non-reducing, i.e. 1:1 projection exposure. Mask or reticle types include binary, attenuating and alternating phase shift types, and various hybrid types. The mask/reticle may transmit or reflect the illumination light beam whilst imparting a patterned cross-section upon it. Programmable mirror arrays are further examples of patterning structures suitable for use with the present invention. One example of such an array is described, for instance, in U.S. Pat. No. 5,296,891, the entire contents of which is incorporated by reference herein. An additional example of a programmable mirror array is disclosed in U.S. Pat. No. 5,523,193, the entire contents of which is incorporated by reference herein. Programmable LCD arrays are further examples of patterning structures suitable for use with the present invention. Such an array is disclosed in U.S. Pat. No. 5,229,872, for instance, the entire contents of which is incorporated by reference herein. Generally, light valves or illumination templates are additional terms used in connection with patterning structures.

A projection optical system for imaging a first object into a region of a second object is disclosed, where the projection optical system includes a plurality of lenses disposed along an optical axis of the projection optical system. The plurality of lenses is dividable into a plurality of non-overlapping groups of lenses, such that a total refractive power of each group of lenses is one of a negative refractive power and a positive refractive power. A first group of lenses has a negative refractive power. A second group disposed directly adjacent to the first group has a positive refractive power. A third group disposed directly adjacent to the second group has a negative refractive power. A fourth group disposed directly adjacent to the third group has a positive refractive power. The fourth group of lenses is that group of lenses among all groups of lenses that is disposed closest to the second object. A refractive power of each lens of the fourth group of lenses is equal to or greater than 0. A diameter of a bundle of imaging rays imaging a first location on the optical axis disposed in a region of the first object into a second location on the optical axis disposed in a region of the second object has a minimum cross section at a third location on the optical axis disposed within the third lens group. Only one pair of lenses disposed between the third location and the second location have opposite refractive powers such that a refractive power of a first lens of the pair of lenses and a refractive power of a second lens of the pair of lenses have opposite signs. The projection optical system can be configured such that the second object is disposed at a working distance from 2 mm to 10 mm from a lens of the projection optical system disposed closest to the second object when in focus.

BRIEF DESCRIPTION OF THE DRAWINGS

In the following, two exemplary embodiments of the present invention are explained in further detail with reference to the Figures, wherein.

DETAILED DESCRIPTION OF EXEMPLARY EMBODIMENTS

Figure 1:
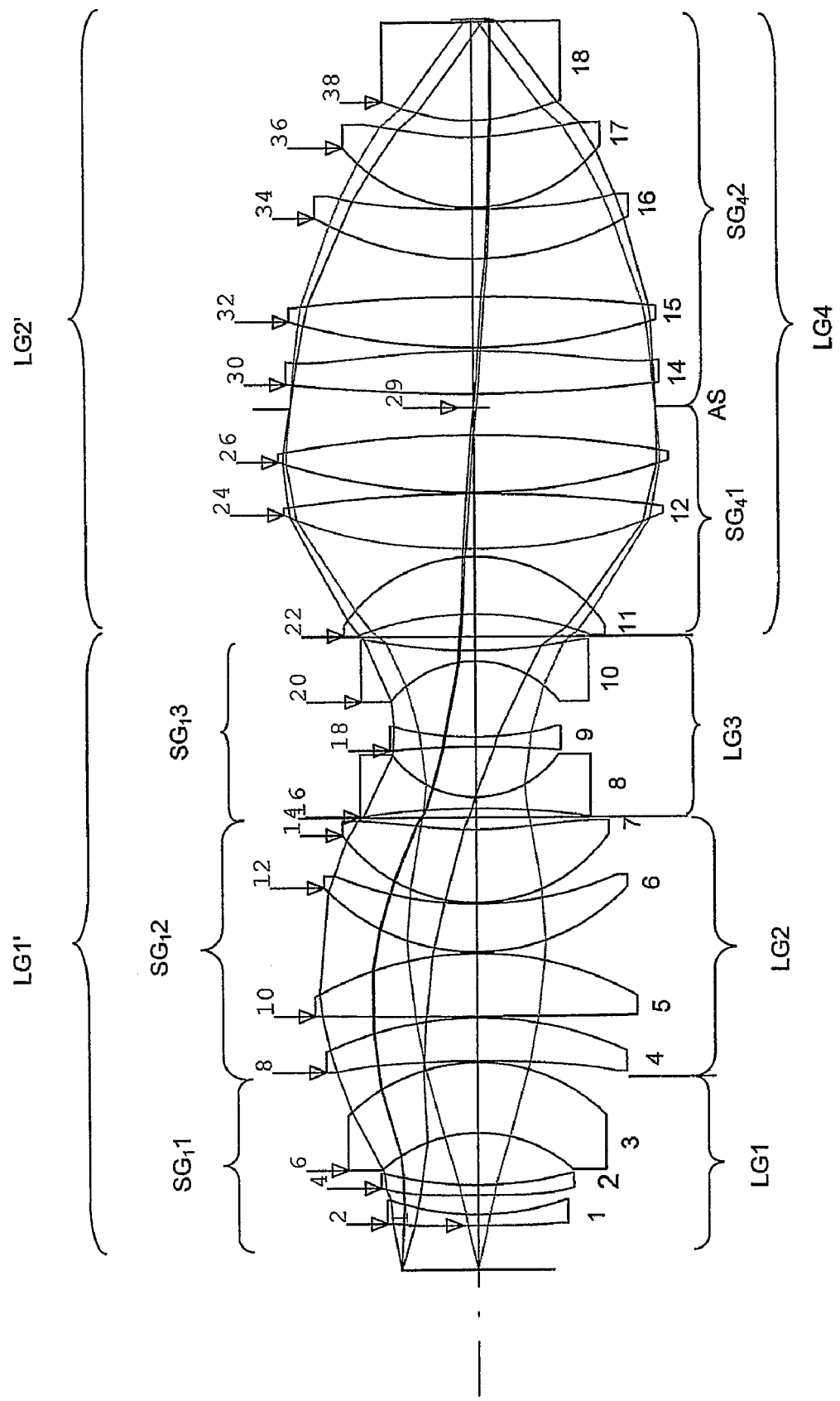
FIG. 1 is an optical path diagram of a first exemplary embodiment of a projection optical system according to the present invention.

In FIG. 1, an optical path diagram of a first exemplary embodiment of a projection optical system according to the present invention is depicted. The first exemplary embodiment has a total of 18 lenses and a numerical aperture on a side of the second object of 0.93.

The lenses of the projection optical system are dividable into a plurality of non-overlapping groups and sub-groups of lenses. One possible arrangement of such groups is indicated in FIG. 1 by brackets below the projection optical system. Referring to the brackets shown below the optical system in FIG. 1, the first group of lenses LG1 includes lenses 1 and 2 and has a total negative refractive power; the second group of lenses LG2 is formed by lenses 3 to 7 and has a total positive optical power; the third group of lenses LG3 includes three lenses 8, 9 and 10 and has a total negative refractive power; the fourth group of lenses LG4 includes eight lenses 11 to 18 and has a total positive refractive power. The fourth group of lenses LG4 comprises an aperture stop AS, a first subgroup $SG_41$ of the fourth group of lenses LG4 is disposed between the third group of lenses LG3 and the aperture stop AS and including three lenses 11, 12, 13 and a second subgroup $SG_42$ of the fourth group of lenses LG4 is disposed in between the aperture stop AS and the second object and includes five lenses 14 to 18.

In particular, in a direction from the first object to the second object, the first group of lenses LG1 includes two meniscus lenses 1, 2 having a negative refractive power each; the second group of lenses includes 5 lenses having positive refractive power each, in particular meniscus lenses 3 and 4, a nearly plano-convex lens 5 and two meniscus lenses 6 and 7; the third group of lenses LG3 includes three biconcave lenses 8, 9 and 10 of negative refractive power; the fourth group of lenses LG4 includes a meniscus lens 11, two biconvex lenses 12 and 13, an aperture stop AS, a biconvex lens 14 having a highly aspherical surface facing in a direction of the second object, another biconvex lens 15, two meniscus lenses 16 and 17 and a plano-convex lens 18. Thus, the fourth group of lenses LG4 only contains lenses having a positive refractive power. A lens having a highly aspherical surface is, on a side of the second object, disposed directly adjacent to the aperture stop, i.e. without any other lens being disposed in between.

In addition, an effective lens diameter of the positive lens 13 in front of the aperture stop AS is larger than an effective diameter of lens 14 behind the aperture stop (in a direction of imaging light traversing the projection optical system), which results in the imaging rays traversing the aperture stop AS in a converging manner.

Detailed information on lens parameters such as thickness of the lens, lens material, radius of the optical surface and the effective diameter of the lens are listed in Table 1 (radius, thickness and diameter are given in units of mm). The lens material is a fused silica material ($SiO_2$), denoted "SIO2V", suitable for use with short wavelengths. The column "thickness" lists distances between adjacent optical surfaces. Thus, the "thickness" indicated next to a first surface of each lens indicates the distance to a second surface of that lens and thus the lens thickness. In addition, each thickness given refers to an axial thickness, i.e. the thickness as measured along the optical axis of the system. In addition, an indication of a position of aspherical surfaces in the projection optical system and their parameters are given in Table 1.

TABLE 1

| Lens# | Surface | Radius | Thickness | Lens material | Diameter |
|---|---|---|---|---|---|
|  | 0 | 0.000 | 32.000 |  | 112.16 |
|  | 1 | 0.000 | −0.001 |  | 123.91 |
| 1 | 2 | −3709.744 | 7.626 | 'SIO2V' | 124.46 |
|  | 3 | 196.798 | 14.125 |  | 127.52 |
| 2 | 4 | 2646.972 | 7.243 | 'SIO2V' | 133.40 |
|  | 5 | 275.985 | 37.891 |  | 136.40 |
| 3 | 6 | −105.344 | 51.314 | 'SIO2V' | 138.86 |
|  | 7 | −135.649 | 0.918 |  | 183.82 |
| 4 | 8 | −1182.525 | 31.527 | 'SIO2V' | 205.22 |
|  | 9 | −261.691 | 0.918 |  | 214.83 |
| 5 | 10 | 8276.131 | 45.844 | 'SIO2V' | 225.79 |
|  | 11 | −240.416 | 0.918 |  | 230.03 |
| 6 | 12 | 155.072 | 34.881 | 'SIO2V' | 216.34 |
|  | 13 | 267.400 | 0.918 |  | 207.47 |
| 7 | 14 | 120.957 | 53.414 | 'SIO2V' | 189.56 |
|  | 15 | 294.983 | 15.116 |  | 172.38 |
| 8 | 16 | −689.681 | 8.261 | 'SIO2V' | 163.80 |
|  | 17 | 75.716 | 36.554 |  | 121.34 |
| 9 | 18 | −713.523 | 7.253 | 'SIO2V' | 120.47 |
|  | 19 | 272.456 | 55.214 |  | 118.83 |
| 10 | 20 | −79.819 | 7.831 | 'SIO2V' | 122.68 |
|  | 21 | 403.671 | 26.366 |  | 161.66 |
| 11 | 22 | −273.029 | 42.100 | 'SIO2V' | 168.66 |
|  | 23 | −116.582 | 5.611 |  | 185.81 |
| 12 | 24 | 554.060 | 40.225 | 'SIO2V' | 268.92 |
|  | 25 | −984.529 | 0.916 |  | 270.81 |
| 13 | 26 | 464.200 | 41.543 | 'SIO2V' | 278.67 |
|  | 27 | −796.439 | 20.008 |  | 278.10 |
|  | STO | 0.000 | 0.000 |  | 267.86 |
|  | 29 | 0.000 | 9.990 |  | 268.18 |
| 14 | 30 | 1256.294 | 31.224 | 'SIO2V' | 266.78 |
|  | 31 | −581.041 | 2.583 |  | 264.87 |
| 15 | 32 | 471.517 | 36.964 | 'SIO2V' | 262.10 |
|  | 33 | −1198.452 | 27.566 |  | 259.07 |
| 16 | 34 | 234.497 | 36.137 | 'SIO2V' | 223.75 |
|  | 35 | 1046.040 | 0.942 |  | 210.56 |
| 17 | 36 | 122.757 | 50.999 | 'SIO2V' | 183.05 |
|  | 37 | 184.771 | 11.998 |  | 157.52 |
| 18 | 38 | 125.481 | 71.977 | 'SIO2V' | 125.59 |
|  | 39 | 0.000 | 2.000 |  | 38.21 |
|  | 40 | 0.000 | 0.000 |  | 28.04 |

Aspherical Surfaces

Surface 2

K: 0.000000  A: 0.276163E−06  B: −.536885E−10
C: 0.644764E−14  D: −.889292E−18  E: 0.125618E−21
F: −.834768E−26  G: 0.000000E+00  H: 0.000000E+00

TABLE 1-continued

| Surface 4 | | |
|---|---|---|
| K: 0.000000 | A: 0.902347E−07 | B: 0.318525E−10 |
| C: −.373980E−14 | D: 0.303698E−18 | E: −.453652E−22 |
| F: 0.332928E−26 | G: 0.000000E+00 | H: 0.000000E+00 |
| Surface 8 | | |
| K: 0.000000 | A: −.331448E−07 | B: 0.339030E−12 |
| C: 0.211595E−16 | D: −.379929E−21 | E: 0.454184E−26 |
| F: −.295402E−31 | G: 0.000000E+00 | H: 0.000000E+00 |
| Surface 15 | | |
| K: 0.000000 | A: −.129984E−06 | B: 0.108745E−11 |
| C: 0.415648E−15 | D: −.786147E−19 | E: 0.563206E−23 |
| F: −.133015E−27 | G: 0.000000E+00 | H: 0.000000E+00 |
| Surface 16 | | |
| K: 0.000000 | A: 0.124853E−08 | B: −.405221E−11 |
| C: 0.291400E−15 | D: 0.423269E−20 | E: −.165418E−23 |
| F: 0.890588E−28 | G: 0.000000E+00 | H: 0.000000E+00 |
| Surface 19 | | |
| K: 0.000000 | A: 0.718198E−07 | B: 0.449275E−11 |
| C: −.135766E−14 | D: 0.428769E−18 | E: −.998296E−22 |
| F: 0.213671E−25 | G: 0.000000E+00 | H: 0.000000E+00 |
| Surface 21 | | |
| K: 0.000000 | A: 0.724641E−07 | B: −.190535E−10 |
| C: 0.167369E−14 | D: −.886328E−19 | E: 0.619650E−24 |
| F: 0.115799E−27 | G: 0.000000E+00 | H: 0.000000E+00 |
| Surface 22 | | |
| K: 0.000000 | A: −.528703E−07 | B: 0.107062E−11 |
| C: 0.383478E−15 | D: −.547368E−19 | E: 0.790212E−23 |
| F: −.535185E−27 | G: 0.000000E+00 | H: 0.000000E+00 |
| Surface 24 | | |
| K: 0.000000 | A: 0.276983E−07 | B: 0.250421E−13 |
| C: −.516347E−16 | D: 0.279865E−20 | E: −.725819E−25 |
| F: 0.714551E−30 | G: 0.000000E+00 | H: 0.000000E+00 |
| Surface 31 | | |
| K: 0.000000 | A: 0.991152E−08 | B: 0.745821E−12 |
| C: 0.682986E−17 | D: −.411366E−21 | E: 0.209636E−25 |
| F: −.109576E−30 | G: 0.000000E+00 | H: 0.000000E+00 |
| Surface 35 | | |
| K: 0.000000 | A: 0.485642E−07 | B: −.159738E−11 |
| C: 0.992089E−16 | D: −.135284E−20 | E: −.261255E−24 |
| F: 0.898748E−29 | G: 0.000000E+00 | H: 0.000000E+00 |
| Surface 37 | | |
| K: 0.000000 | A: −.316359E−06 | B: 0.130364E−10 |
| C: 0.286802E−14 | D: −.501979E−18 | E: 0.352305E−22 |
| F: −.849678E−27 | G: 0.000000E+00 | H: 0.000000E+00 |
| Surface 38 | | |
| K: 0.000000 | A: −.247204E−06 | B: −.885487E−11 |
| C: 0.225865E−14 | D: 0.514684E−18 | E: −.136549E−21 |
| F: 0.113242E−25 | G: 0.000000E+00 | H: 0.000000E+00 |
| Refractive Indices | | |
| GLASS CODE | 193.37 | 193.37 | 193.37 |
| 'SIO2V' | 1.560785 | 1.560786 | 1.560786 |

An aspherical surface can be characterised by the following equation:

$$p(h) = \frac{\frac{h^2}{r}}{1 + \sqrt{1 - (1+K)\frac{h^2}{r^2}}} + C1 \cdot h^4 + C2 \cdot h^6 + \ldots$$

wherein r is radius of curvature in the apex of the aspherical surface (paraxial curvature), h is distance of a point on the aspherical surface from the optical axis (or height of the aspherical surface from the optical axis), p(h) is the sag of the surface in axial direction, i.e. a distance along the direction of the optical axis from a tangent plane to a vertex of the aspheric surface, K is a conical coefficient and C1 . . . C6 are aspherical coefficients.

As evident from Table 1, the first exemplary embodiment of an projection optical system contains 13 aspherical surfaces.

According to particular embodiments of the present invention, the fourth group of lenses comprises at least one aspherical lens having a surface of an aspherical shape such that the surface has, when seen in a radial section, at least one concave portion and at least one convex portion. This may have a consequence that a local refractive power of the lens will change sign with increasing distance from the optical axis. In the particular example of the embodiment illustrated in FIG. 1 and Table 1, surface number 31 is of an aspheric shape such that the surface is convex within a portion including the optical axis, and that the surface is, when seen in a radial section, concave within a ring shaped portion outside of the central convex portion. Lens 14 has a positive refractive power in a region about the optical axis, and has a negative refractive power within the ring shaped concave portion at a distance from the optical axis.

Such aspherical lens having at least one surface of different curvatures may have an advantage for correcting or reducing a spherical aberration of the imaging of the first object onto the second object.

FIG. 1 shows an alternative possibility of dividing the lenses of the optical system into main groups and sub-groups by brackets indicated above the optical system. According to such grouping, the projection optical system comprises two main groups LG1' and LG2' of lenses, wherein the main group LG2' corresponds to the group LG4 according to the grouping illustrated above, and the main group LG1' comprises the lenses of groups LG1, LG2 and LG3 according to the grouping illustrated above. The main group LG1' as indicated in FIG. 1 above the optical system comprises sub-groups SG$_1$1, SG$_1$2, SG$_1$3 corresponding to the groups LG1, LG2, LG3, respectively, according to the grouping illustrated above.

The main group LG1' as indicated by brackets above the optical system in FIG. 1 comprises the lens closest to the first object and lens number 10 such that the negative refractive power of main lens group LG1 is a maximum absolute value. This means, if lens number 10 was not included in the main group LG1', the absolute value of the negative refractive power of such group would be reduced, and if lens number 11 was also included in such group, the absolute value of the negative refractive power would be also reduced.

With such grouping of the lenses of the projection optical system, the second main group LG2' of lenses comprises the highly aspherical lens number 14. Further, each of the lenses of the main lens group LG2' has, on the optical axis, a positive refractive power.

Figure 2:
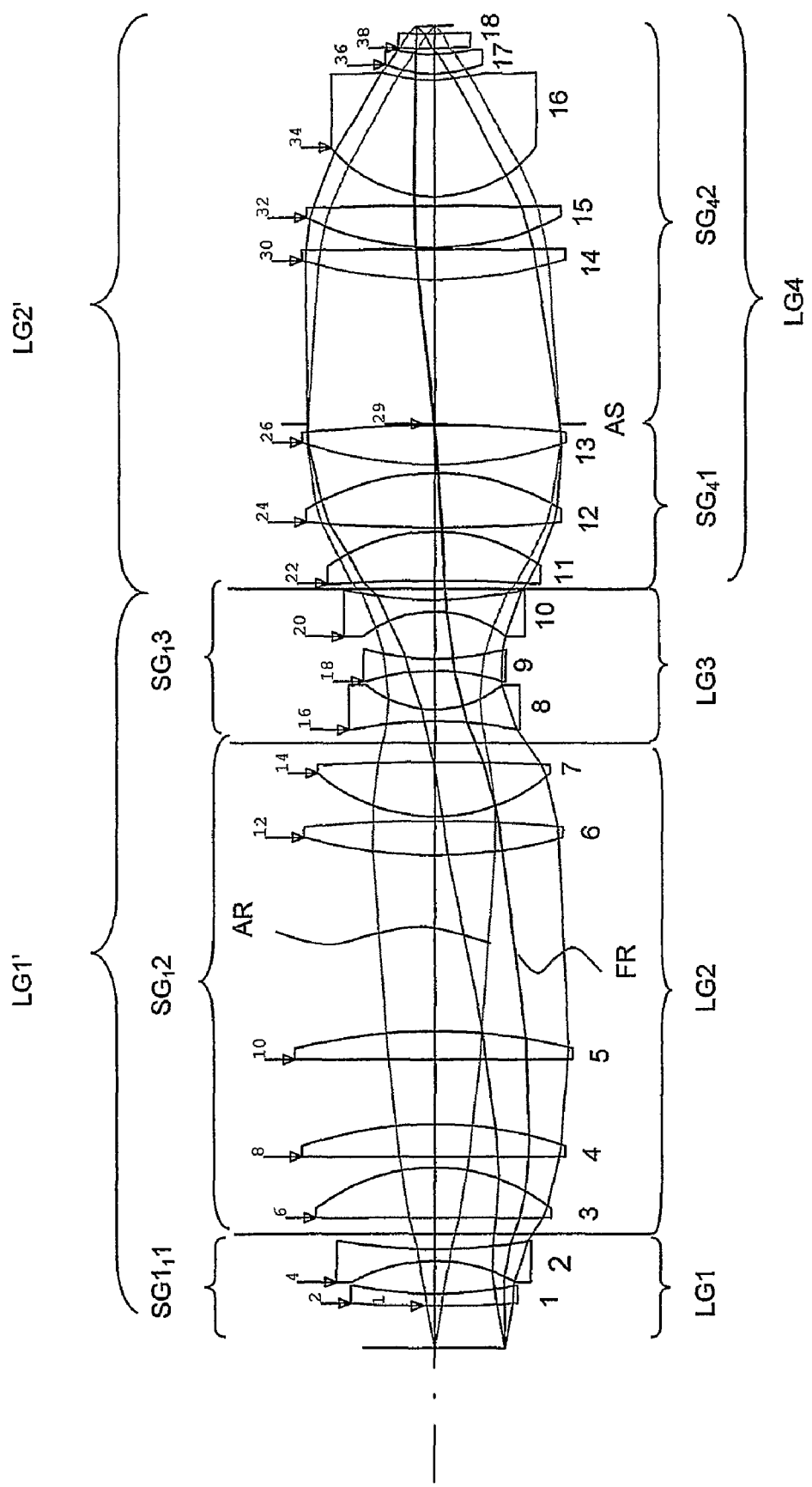
FIG. 2 is an optical path diagram of a second exemplary embodiment of a projection optical system according to the present invention.

FIG. 2 shows an optical path diagram of a second exemplary embodiment of the projection optical system according to the present invention. This embodiment has a numerical aperture of 0.7. The brackets indicate which lens or which lenses are attributed to which group of lenses. The first group of lenses LG1 includes two lenses 1, 2 of negative refractive power and has a total negative refractive power, the second group of lenses LG2 includes five lenses 3, 4, 5, 6 and 7 and has a total positive refractive power, the third group of lenses LG3 includes three lenses 8, 9 and 10 and has a total negative refractive power, the fourth group of lenses LG4 includes eight lenses 11 to 18 and has a total positive refractive power. The fourth group of lenses LG4 may be subdivided into two subgroups, the first subgroup $SG_41$ comprising the lenses of the fourth group that are disposed in between the first object and the aperture stop AS (lenses 11, 12, 13) and the second subgroup $SG_42$ comprising the lenses of the fourth group between the aperture stop AS and the second object (lenses 14 to 18).

In particular, in a direction from the first object to the second object, the first group of lenses LG1 includes a meniscus lens 1 of negative refractive power and a biconcave lens 2; the second group of lenses LG2 includes nearly plano-convex lenses 3, 4 and 5, each of which have their nearly planar surface facing in a direction of the first object, a biconvex lens 6, with lens 6 being separated from lens 5 by a relatively large air gap, and a nearly plano-convex lens 7, the nearly planar surface of which faces in a direction of the second object; the third group of lenses LG3 includes three biconcave lenses 8, 9 and 10; the fourth group of lenses LG4 includes two nearly plano-convex lenses 11, 12, their nearly planar surfaces facing in a direction of the first object, and a biconvex lens 13 in front of the aperture stop AS, these three lenses thus forming the first subgroup $SG_41$; the fourth group of lenses LG4 further includes a second subgroup of lenses $SG_42$ disposed in between the aperture stop AS and the second object, which includes two nearly plano-convex lenses 14 and 15, their nearly planar surfaces facing in a direction of the second object, a meniscus lens 16 of a rather large thickness, a meniscus lens 17 and plane parallel plate 18. Thus, the fourth group of lenses LG4 does not contain any lenses having negative refractive power. Lenses 13 and 14 in the fourth group of lenses LG4 are separated by relatively large air gap.

In FIG. 2, field ray FR and angular ray AR are indicated.

Detailed information on lens parameters such as thickness of the lens, lens material, radius of the optical surface and the value of one half of the effective diameter of the lens for the second exemplary embodiment are listed in Table 2 (radius, thickness and diameter are given in units of mm; the refractive index is given for a wavelength of 193 nm). The lens material denoted "SIO2HL" is a fused silica material ($SiO_2$) suitable for use with short wavelengths, the lens material denoted "CAF2HL" is a calcium fluoride material suitable for use with short wavelengths The column "thickness" is to be read as explained in connection with Table 1. In addition, an indication of a position of aspherical surfaces in the projection optical system and their parameters are given in Table 2.

TABLE 2

| Lens # | Surface | Radius | Thickness | Lens material | Refractive Index | ½ Diameter |
|---|---|---|---|---|---|---|
|  | 0 | 0.000000000 | 32.000000000 |  | 1.00000000 | 54.400 |
|  | 1 | 0.000000000 | 0.000000000 |  | 1.00000000 | 60.078 |
| 1 | 2 | −6024.289735750 | 8.980000000 | SIO2HL | 1.50839641 | 60.429 |
|  | 3 | 304.118583902 | 24.736147249 |  | 1.00000000 | 61.352 |
| 2 | 4 | −131.737066881 | 8.980000000 | SIO2HL | 1.50839641 | 62.003 |
|  | 5 | 417.670275482 | 23.969861507 |  | 1.00000000 | 71.806 |
| 3 | 6 | −3990.989281880 | 37.637419601 | SIO2HL | 1.50839641 | 83.812 |
|  | 7 | −146.539975921 | 8.153868954 |  | 1.00000000 | 87.385 |
| 4 | 8 | −3416112.996320000 | 24.538779242 | SIO2HL | 1.50839641 | 96.467 |
|  | 9 | −315.770118833 | 48.655537324 |  | 1.00000000 | 97.902 |
| 5 | 10 | 1737582.347800000 | 21.341687512 | SIO2HL | 1.50839641 | 102.888 |
|  | 11 | −438.312728675 | 133.848821145 |  | 1.00000000 | 103.350 |
| 6 | 12 | 372.235399256 | 25.824530368 | SIO2HL | 1.50839641 | 96.078 |
|  | 13 | −1253.770358400 | 3.388364430 |  | 1.00000000 | 95.005 |
| 7 | 14 | 137.250353219 | 40.923861302 | SIO2HL | 1.50839641 | 85.977 |
|  | 15 | −2019.355651910 | 30.814556576 |  | 1.00000000 | 82.298 |
| 8 | 16 | −317.971034610 | 8.980000000 | SIO2HL | 1.50839641 | 62.837 |
|  | 17 | 83.280160987 | 28.917489545 |  | 1.00000000 | 51.912 |
| 9 | 18 | −174.767947356 | 8.980000000 | SIO2HL | 1.50839641 | 51.559 |
|  | 19 | 199.374837069 | 35.383708199 |  | 1.00000000 | 52.209 |
| 10 | 20 | −89.313803180 | 8.980000000 | SIO2HL | 1.50839641 | 54.110 |
|  | 21 | 287.142946942 | 14.615095575 |  | 1.00000000 | 66.604 |
| 11 | 22 | −1197.273088600 | 36.948225159 | SIO2HL | 1.50839641 | 71.075 |
|  | 23 | −141.217428495 | 3.127763800 |  | 1.00000000 | 78.665 |
| 12 | 24 | 1110.602242140 | 41.309109595 | SIO2HL | 1.50839641 | 91.740 |
|  | 25 | −186.778606243 | 6.522919571 |  | 1.00000000 | 94.518 |
| 13 | 26 | 301.130921191 | 29.860505588 | SIO2HL | 1.50839641 | 97.806 |
|  | 27 | −919.702780682 | 0.844618989 |  | 1.00000000 | 97.243 |
|  | 28 | 0.000000000 | 0.000000000 |  | 1.00000000 | 96.338 |
|  | 29 | 0.000000000 | 109.449770983 |  | 1.00000000 | 96.356 |
| 14 | 30 | 331.354934334 | 22.987387070 | SIO2HL | 1.50839641 | 97.785 |
|  | 31 | −73153.815546800 | 1.202668744 |  | 1.00000000 | 97.069 |
| 15 | 32 | 215.009873195 | 31.665497873 | SIO2HL | 1.50839641 | 94.273 |
|  | 33 | −4631.244060050 | 7.068412058 |  | 1.00000000 | 92.119 |
| 16 | 34 | 99.799368778 | 88.612555488 | SIO2HL | 1.50839641 | 75.558 |
|  | 35 | 157.037995467 | 4.585859982 |  | 1.00000000 | 39.957 |
| 17 | 36 | 105.913726954 | 14.729270754 | CAF2HL | 1.46788655 | 35.167 |
|  | 37 | 142.187579405 | 4.618008084 |  | 1.00000000 | 27.567 |
| 18 | 38 | 0.000000000 | 10.782377974 | CAF2HL | 1.46788655 | 25.627 |
|  | 39 | 0.000000000 | 5.996392452 |  | 1.00000000 | 19.660 |
|  | 40 | 0.000000000 | 0.000000000 |  | 1.00000000 | 13.600 |

TABLE 2-continued

Aspherical Surfaces

Surface 2

K: 0.0000
C1: 1.89567103e−007    C2: −6.14954159e−012
C3: 5.99696092e−016    C4: −1.70049965e−019
C5: 3.40804937e−023    C6: −2.46308378e−027
C7: 0.00000000e+000    C8: 0.00000000e+000
C9: 0.00000000e+000

Surface 6

K: 0.0000
C1: 5.10156924e−009    C2: 1.69855235e−012
C3: −1.06288680e−016   C4: 4.97146455e−021
C5: −4.15785888e−025   C6: 1.75008366e−029
C7: 0.00000000e+000    C8: 0.00000000e+000
C9: 0.00000000e+000

Surface 13

K: 0.0000
C1: −8.90443356e−009   C2: 1.68794796e−013
C3: −5.52889921e−018   C4: 2.53152609e−022
C5: −1.32794410e−026   C6: 6.89511513e−031
C7: 0.00000000e+000    C8: 0.00000000e+000
C9: 0.00000000e+000

Surface 26

K: 0.0000
C1: −7.14236794e−009   C2: 4.66880907e−014
C3 1.84149146e−019     C4: 1.30780764e−022
C5: −1.32931107e−027   C6: 1.29777704e−031
C7: 0.00000000e+000    C8: 0.00000000e+000
C9: 0.00000000e+000

Surface 30

K: 0.0000
C1: −2.73011692e−009   C2: −5.36841078e−013
C3: −7.87215774e−018   C4: −3.92093559e−022
C5: 2.11192637e−026    C6: −1.94208025e−030
C7: 0.00000000e+000    C8: 0.00000000e+000
C9: 0.00000000e+000

Surface 35

K: 0.0000
C1: −3.40706173e−008   C2: −1.34186182e−011
C3: −5.33579678e−015   C4: 1.06622971e−018
C5: −5.16132064e−023   C6: 0.00000000e+000
C7: 0.00000000e+000    C8: 0.00000000e+000
C9: 0.00000000e+000

It is to be noted that lenses 17 and 18 of the embodiment illustrated in FIG. 2 and Table 2 are made of a crystalline material which is, in the present example, calcium fluoride. Calcium fluoride has an intrinsic birefringence, and it is of an advantage to adjust a relative orientation of the crystals of the respective lenses such that a combined birefringence effect of both lenses is compensated to at least some extent. Background information on relative orientation of crystalline lenses may be taken e.g. from US 2003/0137733 A1. The entire contents of this document are incorporated herein by reference.

The crystalline material may have an advantage in a long-term stability of optical properties provided by the projection optical system. In particular, such material has an advantage in view of radiation induced effects, such as compaction or other.

In the embodiment depicted in FIG. 2, the first main group of lenses LG1', or first through third groups of lenses LG1 through LG3, respectively, comprises lens 5 as the largest lens of the projection optical system, i.e. that lens of the plurality of lenses having the surface of the largest effective diameter (see also Table 2). Meniscus lens 3 has optical surfaces having radii of greater than 140 mm. The exact values of the radii may be taken from Table 2. One radius is even greater than 3990 mm. A ratio of the radius of the first surface to the radius of the second surface is about 27. The effective diameter of lens 3 is about 84% of the largest effective diameter of the largest lens.

Figure 3:
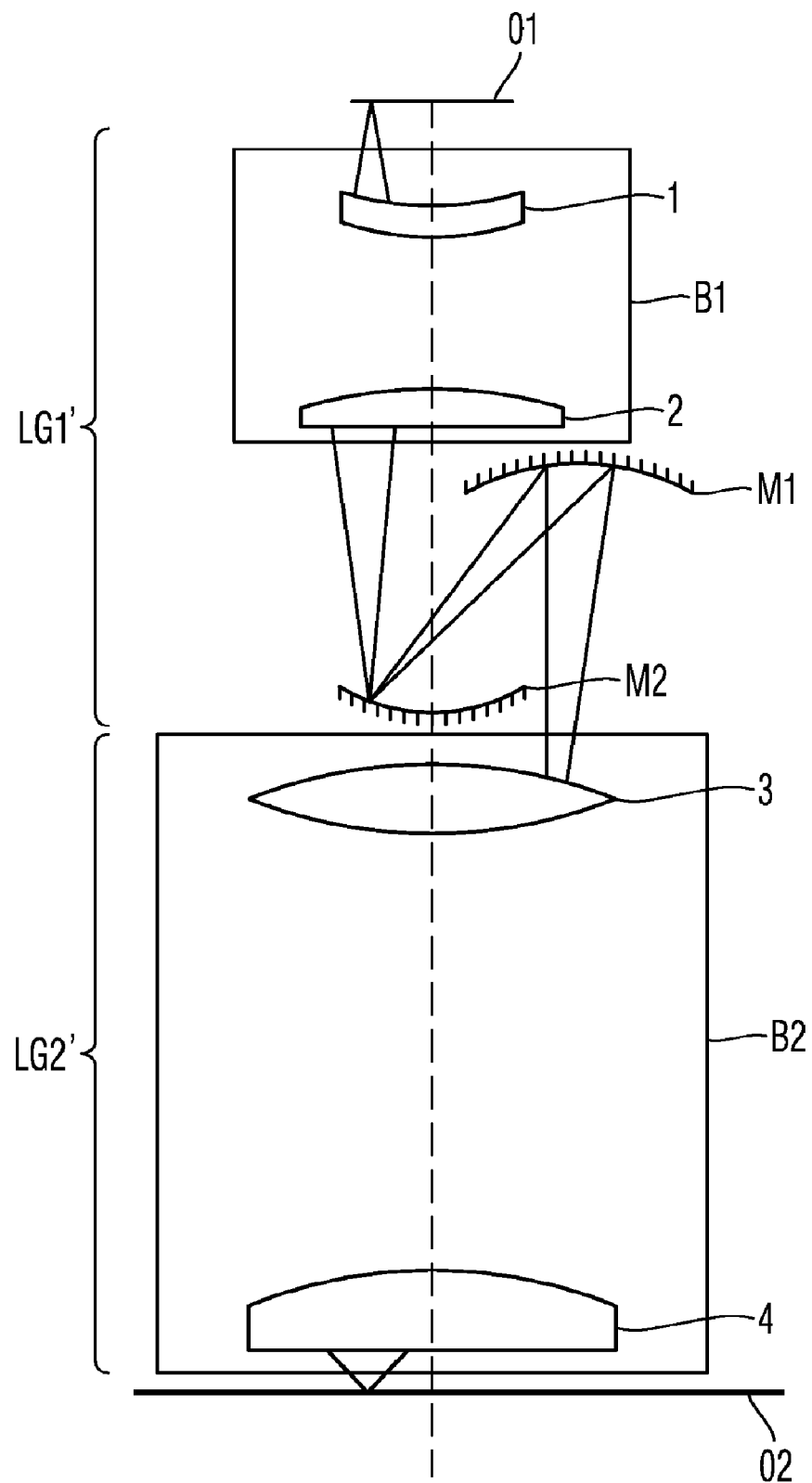
FIG. 3 is a simplified optical path diagram of a catadioptric embodiment of a projection optical system according to the present invention.

In FIG. 3, a schematic and very simplified illustration of a catadioptric embodiment of the present invention is depicted.

The first object O1 is imaged onto the second object O2 by two non-overlapping main lens groups LG1' and LG2'. LG1' denotes a first main group of lenses, which contains a lens which out of all lenses of the plurality of lenses of the projection optical system is disposed closest to the first object O1. The second main group of lenses LG2', on the other hand, contains a lens which, out of all lenses of the plurality of lenses of the projection optical system, is disposed closest to the second object O2. The first main group of lenses LG1' comprises several lenses, out of which only two, lens 1 and lens 2 are schematically illustrated as being part of a lens system B1 of the first main group of lenses LG1'. The first main group of lenses LG1' further comprises two mirrors M1 and M2. The second main group of lenses LG2' comprises plural lenses in a lens system B2, out of which only two lenses, lens 3 and lens 4 are shown. In other exemplary embodiments, the mirrors could be arranged differently and/or one or more lenses could be disposed in an optical path between the two mirrors M1 and M2. Further suitable embodiments will be readily apparent to the skilled person.

In summary, a projection optical system comprises a plurality of lenses disposed along an optical axis of the projection optical system; wherein the plurality of lenses is dividable into four non-overlapping groups of lenses, such that a total refractive power of each group of lenses is one of a negative refractive power and a positive refractive power; and wherein a refractive power of each lens of the fourth group of lenses is equal to or greater than 0. A lens of the third group of lenses which is disposed directly adjacent to a lens of the fourth group of lenses may have a concave surface facing towards the second object.

The present invention has been described by way of exemplary embodiments to which it is not limited. Variations and modifications will occur to those skilled in the art without departing from the scope of the invention as described in the claims appended hereto.

The invention claimed is:

1. A projection optical system for imaging a first object into a region of a second object, the projection optical system comprising:
   a plurality of lenses disposed along an optical axis of the projection optical system;
   wherein the plurality of lenses is dividable into a plurality of non-overlapping groups of lenses, such that a total refractive power of each group of lenses is one of a negative refractive power and a positive refractive power;
   wherein a first group of lenses has a negative refractive power;
   wherein a lens closest to the first object of the plurality of lenses is included in the first group of lenses;
   wherein a refractive power of each lens of the first group of lenses is a negative refractive power;
   wherein a second group disposed directly adjacent to the first group has a positive refractive power;
   wherein a third group disposed directly adjacent to the second group has a negative refractive power;
   wherein a fourth group disposed directly adjacent to the third group has a positive refractive power;
   wherein the fourth group of lenses is that group of lenses among all groups of lenses that is disposed closest to the second object;
   wherein a refractive power of each lens of the fourth group of lenses is equal to or greater than 0,
   wherein a lens of the third group of lenses which is disposed directly adjacent to a lens of the fourth group of lenses has a concave surface facing towards the second object, and
   wherein the fourth group of lenses further comprises an aperture stop.

2. The projection optical system according to claim 1, wherein the refractive power of each lens of the fourth group of lenses is greater than 0.

3. The projection optical system according to claim 1, having a numerical aperture on a side of the second object of 0.7 or greater.

4. A projection optical system for imaging a first object into a region of a second object, the projection optical system comprising:
   a plurality of lenses disposed along an optical axis of the projection optical system;
   wherein the plurality of lenses is dividable into a plurality of non-overlapping groups of lenses, such that a total refractive power of each group of lenses is one of a negative refractive power and a positive refractive power;
   wherein a first group of lenses has a negative refractive power;
   wherein a lens closest to the first object of the plurality of lenses is included in the first group of lenses;
   wherein a refractive power of each lens of the first group of lenses is a negative refractive power;
   wherein a second group disposed directly adjacent to the first group has a positive refractive power;
   wherein a third group disposed directly adjacent to the second group has a negative refractive power;
   wherein a fourth group disposed directly adjacent to the third group has a positive refractive power;
   wherein the fourth group of lenses is that group of lenses among all groups of lenses that is disposed closest to the second object;
   wherein a refractive power of each lens of the fourth group of lenses is equal to or greater than 0,
   wherein a diameter of a bundle of imaging rays imaging a first location on the optical axis disposed in a region of the first object into a second location on the optical axis disposed in a region of the second object has a minimum cross section at a third location on the optical axis disposed within the third lens group, and
   wherein only one pair of lenses disposed between the third location and the second location have opposite refractive powers such that a refractive power of a first lens of the pair of lenses and a refractive power of a second lens of the pair of lenses have opposite signs.

5. The projection optical system according to claim 4, wherein an aperture stop is disposed at a fourth location on the optical axis, and wherein the one pair of lenses is disposed between the third location and the fourth location.

6. The projection optical system according to claim 4 wherein a lens of the third group of lenses which is disposed directly adjacent to a lens of the fourth group of lenses has a concave surface facing towards the second object.

7. The projection optical system according to claim 4, wherein a largest effective diameter among effective diameters of the lenses having a refractive power of equal to or greater than 0 is by a factor of between 1.1 and 2.5 greater than an effective diameter of any lens having a negative refractive power.

8. The projection optical system according to claim 4 wherein an effective diameter of any lens having a negative refractive power is less than L/5, wherein L is a distance between the first object and the second object.

9. The projection optical system according to claim 4, wherein each lens of the first and third groups of lenses has a smaller diameter than any of the lenses of the second group of lenses.

10. The projection optical system according to claim 4, wherein a refractive power of each lens of the second group of lenses is greater than or equal to zero.

11. The projection optical system according to claim 4, wherein a refractive power of each lens of the third group of lenses is a negative refractive power.

12. The projection optical system according to claim 11, wherein the third group of lenses comprises at least two lenses.

13. The projection optical system according to claim 4, wherein at least one lens of the fourth group of lenses has at least one aspherical surface, wherein an axial distance between the aspherical surface and a best fitting sphere of the aspherical surface is more than about 1.0 mm.

14. The projection optical system according to claim 13, wherein the fourth group of lenses further comprises an aperture stop and wherein the at least one aspherical lens is disposed in between the aperture stop and the second object.

15. The projection optical system according to claim 4, wherein at least two lenses of the lenses of the third and fourth groups of lenses have at least one aspherical surface, wherein an axial distance between the respective aspherical surface and a best fitting sphere thereof is more than about 1.0 mm.

16. The projection optical system according to claim 4, wherein at least three lenses of the lenses of the third and fourth groups of lenses have at least one aspherical surface, wherein an axial distance between the respective aspherical surface and a best fitting sphere thereof is more than about 1.0 mm.

17. The projection optical system according to claim 4, having a region extending from the first object along the optical axis towards the second object, in which region the following condition is fulfilled: $|h_{au}/h_{fc}|<1.2$, wherein $h_{au}$ is a distance between the optical axis and a field ray that originates from a point of the first object having a maximum distance from the optical axis, wherein the field ray originates from that point in a direction parallel to the optical axis, and $h_{fc}$ is a distance between the optical axis and an angular ray originating from an axial point of the first object, the angular ray forming a largest possible angle with the optical axis such that the ray contributes to imaging of the first object into the region of the second object, wherein $h_{au}$ and $h_{fc}$ are measured at the same location on the optical axis; and wherein said region extends over a distance of at least one third of an overall distance between the first and the second object.

18. The projection optical system according to claim 17, wherein at least two aspherical surfaces are disposed in said region.

19. The projection optical system according to claim 4, wherein a distance on the optical axis between any two directly adjacent lenses of the second group of lenses is smaller than L/100, wherein L is a distance between the first object and the second object.

20. The projection optical system according to claim 4, wherein at least one distance on the optical axis between two directly adjacent lenses of the second group of lenses is greater than L/50, wherein L is a distance between the first object and the second object.

21. The projection optical system according to claim 4, wherein a ratio of a difference between a total length of the fourth group of lenses and a sum of thicknesses of all lenses of the fourth group of lenses over the total length of the fourth group of lenses is greater than 0.3.

22. The projection optical system according to claim 4, wherein the first group of lenses comprises at least two lenses.

23. The projection optical system according to claim 4, wherein the fourth group of lenses comprises at least five lenses.

24. The projection optical system according to claim 4, wherein the fourth group of lenses comprises an aperture stop and wherein at least three lenses are disposed in between the aperture stop and the second object.

25. The projection optical system according to claim 4, wherein the fourth group of lenses comprises an aperture stop and wherein at least two lenses are disposed in between the aperture stop and the second object.

26. The projection optical system according to claim 4, wherein at least two lenses of the fourth group of lenses are made of a crystalline material having an intrinsic birefringence.

27. The projection optical system according to claim 26, wherein crystal orientations of the at least two lenses of the crystalline material are oriented relative to each other such that at least a portion of a birefringence of a first lens of the two lenses of the crystalline material is compensated by a second lens of the two lenses of the crystalline material.

28. The projection optical system according to claim 26, wherein the crystalline material comprises $CaF_2$.

29. The projection optical system according to claim 4, wherein at least one lens of the fourth group of lenses is an aspherical lens having a surface of an aspherical shape such that the surface has, when seen in a radial section, at least one concave portion and at least one convex portion.

30. The projection optical system according to claim 29, wherein the surface of the at least one aspherical lens has, when seen in a radial direction, two concave portions and one convex portion between the two concave portions.

31. The projection optical system according to claim 4, wherein, on the optical axis, at least one distance between two directly adjacent lenses of the fourth group of lenses is greater than L/50, wherein L is a distance between the first object and the second object.

32. The projection optical system according to claim 4, wherein the projection optical system is configured such that the second object is disposed at a working distance from 2 mm to 10 mm from a lens of the projection optical system disposed closest to the second object when in focus.

33. The projection optical system according to claim 4, having a numerical aperture on a side of the second object of 0.9 or greater.

34. A projection optical system for imaging a first object into a region of a second object, the projection optical system comprising:
  a plurality of lenses disposed along an optical axis of the projection optical system;
  wherein the plurality of lenses is dividable into two non-overlapping groups of lenses,
  wherein a first main group of lenses of the two non-overlapping groups of lenses comprises a lens closest to the first object;
  wherein a second main group of lenses of the two non-overlapping groups of lenses comprises a lens closest to the second object;
  wherein the plurality of lenses is divided into the first and second main groups of lenses such that a refractive power of the first main group of lenses has a maximum negative value;
  wherein lens surfaces of the first and second main groups of lenses include a plurality of aspherical lens surfaces, and
  wherein a first aspherical lens surface of the plurality of aspherical lens surfaces is configured such that an axial distance between the aspherical lens surface and a best fitting sphere thereof is more than about 1.0 mm.

35. The projection optical system according to claim 34, wherein the axial distance between the aspherical lens surface and the best fitting sphere thereof is more than about 1.5 mm.

36. The projection optical system according to claim 34, wherein the first aspherical lens surface has a central portion traversed by an optical axis of the projection optical system and a ring portion disposed outside of the central portion, and wherein a local refractive power of the lens experienced by a light beam traversing the central portion and a local refractive power of the lens experienced by a light beam traversing the ring portion have opposite signs.

37. The projection optical system according to claim 34, wherein the second main group of lenses further comprises an aperture stop.

38. The projection optical system according to claim 34, wherein the first main group of lenses is dividable into a plurality of non-overlapping sub-groups of lenses such that a total refractive power of each sub-group of lenses is one of a negative refractive power and a positive refractive power.

39. The projection optical system according to claim 34, wherein the first main group of lenses is dividable into three non-overlapping sub-groups of lenses, wherein a first sub-group of lenses of the three non-overlapping sub-groups of lenses has a negative refractive power and is disposed closest to the first object, wherein a second sub-group of lenses of the three non-overlapping subgroups of lenses has a positive refractive power, and wherein a third sub-group of lenses of the three non-overlapping sub-groups of lenses has a negative refractive power.

40. The projection optical system according to claim 39, wherein a refractive power of each lens of the first sub-group of lenses is a negative refractive power.

41. The projection optical system according to claim 39, wherein a refractive power of each lens of the third sub-group of lenses is a negative refractive power.

42. The projection optical system according to claim 41, wherein the third sub-group of lenses comprises at least two lenses.

43. The projection optical system according to claim 34, having a region extending from the first object along the optical axis towards the second object, in which region the following condition is fulfilled: $|h_{au}/h_{fc}|<1.2$, wherein $h_{au}$ is a distance between the optical axis and a field ray that originates from a point of the first object having a maximum distance from the optical axis, wherein the field ray originates from that point in a direction parallel to the optical axis, and $h_{fc}$ is a distance between the optical axis and an angular ray originating from an axial point of the first object, the angular ray forming a largest possible angle with the optical axis such that the ray contributes to imaging of the first object into the region of the second object, wherein $h_{au}$ and $h_{fc}$ are measured at the same location on the optical axis; and wherein said region extends over a distance of at least one third of an overall distance between the first and the second object.

44. The projection optical system according to claim 43, wherein at least two aspherical surfaces are disposed in said region.

45. The projection optical system according to claim 34, wherein the second main group of lenses comprises at least five lenses.

46. The projection optical system according to claim 34, wherein the second main group of lenses comprises an aperture stop and wherein at least three lenses are disposed in between the aperture stop and the second object.

47. The projection optical system according to claim 34, wherein the second main group of lenses comprises an aperture stop and wherein at least two lenses are disposed in between the aperture stop and the second object.

48. The projection optical system according to claim 34, wherein at least two lenses of the second main group of lenses are made of a crystalline material having an intrinsic birefringence.

49. The projection optical system according to claim 48, wherein crystal orientations of the at least two lenses of the crystalline material are oriented relative to each other such that at least a portion of a birefringence of a first lens of the two lenses of the crystalline material is compensated by a second lens of the two lenses of the crystalline material.

50. The projection optical system according to claim 48, wherein the crystalline material comprises $CaF_2$.

51. The projection optical system according to claim 34, wherein, on the optical axis, at least one distance between two directly adjacent lenses of the second main group of lenses is greater than L/50, wherein L is a distance between the first object and the second object.

52. The projection optical system according to claim 34, wherein the projection optical system is configured such that the second object is disposed at a working distance from 2 mm to 10 mm from a lens of the projection optical system disposed closest to the second object when in focus.

53. The projection optical system according to claim 34, having a numerical aperture on a side of the second object of 0.7 or greater.

54. The projection optical system according to claim 34, having a numerical aperture on a side of the second object of 0.9 or greater.

55. The projection optical system according to claim 34, wherein the projection optical system is a catadioptric projection optical system.

56. A projection optical system for imaging a first object into a region of a second object, the projection optical system comprising:
   a plurality of lenses disposed along an optical axis of the projection optical system;
   wherein the plurality of lenses is dividable into two non-overlapping groups of lenses,
   wherein a first main group of lenses of the two non-overlapping groups of lenses comprises a lens closest to the first object;
   wherein a second main group of lenses of the two non-overlapping groups of lenses comprises a lens closest to the second object;
   wherein the plurality of lenses is divided into the first and second main groups of lenses such that a refractive power of the first main group of lenses has a maximum negative value; and
   wherein lens surfaces of the first and second main groups of lenses include a plurality of aspherical lens surfaces, and
   wherein a first aspherical lens surface of the plurality of aspherical lens surfaces has a central portion traversed by an optical axis of the projection optical system and a ring portion disposed outside of the central portion, and
   wherein a local refractive power of the lens experienced by a light beam traversing the central portion and a local refractive power of the lens experienced by a light beam traversing the ring portion have opposite signs.

57. The projection optical system according to claim 56, wherein the first aspherical lens surface is configured such that an axial distance between the aspherical lens surface and a best fitting sphere thereof is more than about 1.0 mm.

58. The projection optical system according to claim 56, wherein the first aspherical lens surface is configured such that an axial distance between the aspherical lens surface and a best fitting sphere thereof is more than about 1.5 mm.

59. A projection optical system configured to image a first object into a region of a second object, the projection optical system comprising:
   a plurality of lenses disposed along an optical axis of the projection optical system;
   wherein:
      the plurality of lenses is dividable into a plurality of non-overlapping groups of lenses, such that a total refractive power of each group of lenses is one of a negative refractive power and a positive refractive power;

the groups are selected such that a sum of absolute values of the total refractive powers of the groups is a maximum value;

a first group of lenses has a negative refractive power;

a lens closest to the first object of the plurality of lenses is included in the first group of lenses;

a refractive power of each lens of the first group of lenses is a negative refractive power;

a second group disposed directly adjacent to the first group has a positive refractive power;

a third group disposed directly adjacent to the second group has a negative refractive power;

a fourth group disposed directly adjacent to the third group has a positive refractive power;

the fourth group of lenses is that group of lenses among all groups of lenses that is disposed closest to the second object;

a refractive power of each lens of the fourth group of lenses is equal to or greater than 0, and a lens of the third group of lenses which is disposed directly adjacent to a lens of the fourth group of lenses has a concave surface facing towards the second object.

60. The projection optical system according to claim 59, wherein a largest effective diameter among effective diameters of the lenses having a refractive power of equal to or greater than 0 is by a factor of between 1.1 and 2.5 greater than an effective diameter of any lens having a negative refractive power.

61. The projection optical system according to claim 59, wherein an effective diameter of any lens having a negative refractive power is less than L/5, wherein L is a distance between the first object and the second object.

62. The projection optical system according to claim 59, wherein a refractive power of each lens of the third group of lenses is a negative refractive power.

63. The projection optical system according to claim 59, wherein at least one lens of the fourth group of lenses has at least one aspherical surface, and an axial distance between the aspherical surface and a best fitting sphere of the aspherical surface is more than about 1.0 mm.

64. The projection optical system according to claim 59, wherein the projection optical system has a region extending from the first object along the optical axis towards the second object, in which region the following condition is fulfilled:

$$|h_{au}/h_{fc}|<1.2,$$

wherein:

$h_{au}$ is a distance between the optical axis and a field ray that originates from a point of the first object having a maximum distance from the optical axis, wherein the field ray originates from that point in a direction parallel to the optical axis; and $h_{fc}$ is a distance between the optical axis and an angular ray originating from an axial point of the first object, the angular ray forming a largest possible angle with the optical axis such that the ray contributes to imaging of the first object into the region of the second object;

$h_{au}$ and $h_{fc}$ are measured at the same location on the optical axis; and said region extends over a distance of at least one third of an overall distance between the first and the second object.

65. The projection optical system according to claim 59, wherein a ratio of a difference between a total length of the fourth group of lenses and a sum of thicknesses of all lenses of the fourth group of lenses over the total length of the fourth group of lenses is greater than 0.3.

66. The projection optical system according to claim 59, wherein at least two lenses of the fourth group of lenses are made of a crystalline material having an intrinsic birefringence.

67. The projection optical system according to claim 59, wherein at least one lens of the fourth group of lenses is an aspherical lens having a surface of an aspherical shape such that the surface has, when seen in a radial section, at least one concave portion and at least one convex portion.

68. The projection optical system according to claim 59, wherein the projection optical system is configured such that the second object is disposed at a working distance from 2 mm to 10 mm from a lens of the projection optical system disposed closest to the second object when in focus.

69. The projection optical system according to claim 59, having a numerical aperture on a side of the second object of 0.9 or greater.

70. A projection optical system for imaging a first object into a region of a second object, the projection optical system comprising:

a plurality of lenses disposed along an optical axis of the projection optical system;

wherein the plurality of lenses is dividable into two non-overlapping groups of lenses, wherein a first main group of lenses of the two non-overlapping groups of lenses comprises a lens closest to the first object;

wherein a second main group of lenses of the two non-overlapping groups of lenses comprises a lens closest to the second object;

wherein the plurality of lenses is divided into the first and second main groups of lenses such that a refractive power of the first main group of lenses has a maximum negative value;

wherein a refractive power of each lens of the second main group of lenses is equal to or greater than 0, wherein the projection optical system has a region extending from the first object along the optical axis towards the second object, in which region the following condition is fulfilled:

$$|h_{au}/h_{fc}|<1.2,$$

wherein $h_{au}$ is a distance between the optical axis and a field ray that originates from a point of the first object having a maximum distance from the optical axis, wherein the field ray originates from that point in a direction parallel to the optical axis, wherein $h_{fc}$ is a distance between the optical axis and an angular ray originating from an axial point of the first object, the angular ray forming a largest possible angle with the optical axis such that the ray contributes to imaging of the first object into the region of the second object, wherein $h_{au}$ and $h_{fc}$ are measured at the same location on the optical axis; and wherein said region extends over a distance of at least one third of an overall distance between the first and the second object.

71. A projection optical system for imaging a first object into a region of a second object, the projection optical system comprising:

a plurality of lenses disposed along an optical axis of the projection optical system; wherein the plurality of lenses is dividable into two non-overlapping groups of lenses, wherein a first main group of lenses of the two non-overlapping groups of lenses comprises a lens closest to the first object;

wherein a second main group of lenses of the two non-overlapping groups of lenses comprises a lens closest to the second object;

wherein the plurality of lenses is divided into the first and second main groups of lenses such that a refractive power of the first main group of lenses has a maximum negative value;

wherein a refractive power of each lens of the second main group of lenses is equal to or greater than 0, and wherein at least two lenses of the second main group of lenses are made of a crystalline material having an intrinsic birefringence.

72. The projection optical system according to claim 71, wherein the refractive power of each lens of the second main group of lenses is greater than 0.

73. A projection optical system for imaging a first object into a region of a second object, the projection optical system comprising:
   a plurality of lenses disposed along an optical axis of the projection optical system; wherein the plurality of lenses is dividable into two non-overlapping groups of lenses,
   wherein a first main group of lenses of the two non- overlapping groups of lenses comprises a lens closest to the first object;
   wherein a second main group of lenses of the two non-overlapping groups of lenses comprises a lens closest to the second object;
   wherein the plurality of lenses is divided into the first and second main groups of lenses such that a refractive power of the first main lens group has a maximum negative value;
   wherein the plurality of lenses comprises one largest lens having a surface having a largest effective diameter out of all surface of lenses of the plurality of lenses, the one largest lens being contained in either the first or second main group of lenses,
   wherein each of the plurality of lenses which is a meniscus lens and which has a surface having an effective diameter that is at least 50% of the largest effective diameter and which is comprised in the either first or second main group of lenses containing the largest lens fulfils the following requirement:

$|r_1| \geq 220$ mm and $|r_2| \geq 220$ mm, and wherein $r_1$ is a radius of curvature of a first optical surface of the meniscus lens, and $r_2$ is a radius of curvature of a second optical surface of the meniscus lens.

74. The projection optical system according to claim 73, wherein each meniscus lens which has a surface having an effective diameter that is at least 70% of the largest effective diameter and which is comprised in the either first or second main group of lenses containing the largest lens fulfils the requirement.

75. The projection optical system according to claim 73, wherein each meniscus lens comprised in the either first or second main group of lenses further fulfils at least one of the following requirements:

$|r_1| \geq 300$ mm and $|r_2| \geq 300$ mm.

76. A projection optical system for imaging a first object into a region of a second object, the projection optical system comprising:
   a plurality of lenses disposed along an optical axis of the projection optical system; wherein the plurality of lenses is dividable into two non-overlapping groups of lenses,
   wherein a first main group of lenses of the two non-overlapping groups of lenses comprises a lens closest to the first object;
   wherein a second main group of lenses of the two non-overlapping groups of lenses comprises a lens closest to the second object;
   wherein the plurality of lenses is divided into the first and second main groups of lenses such that a refractive power of the first main lens group has a maximum negative value;
   wherein the plurality of lenses comprises one largest lens having a surface having a largest effective diameter out of all surface of lenses of the plurality of lenses, the one largest lens being contained in either the first or second main group of lenses,
   wherein each of the plurality of lenses which is a meniscus lens and which has a surface having an effective diameter that is at least 50% of the largest effective diameter and which is comprised in the either first or second main group of lenses containing the largest lens fulfils the following requirement:

$|r_1| \geq 140$ mm and $|r_2| \geq 140$ mm, wherein $r_1$ is a radius of curvature of a first optical surface of the meniscus lens, and $r_2$ is a radius of curvature of a second optical surface of the meniscus lens,wherein each meniscus lens comprised in the either first or second main group of lenses further fulfils the following requirement:

$|r_1/r_2| > 1.5$; and wherein $r_1$ indicates the radius of curvature of the concave surface of the meniscus lens.

77. A projection optical system for imaging a first object into a region of a second object, the projection optical system comprising:
   a plurality of lenses disposed along an optical axis of the projection optical system; wherein the plurality of lenses is dividable into two non-overlapping groups of lenses,
   wherein a first main group of lenses of the two non-overlapping groups of lenses comprises a lens closest to the first object;
   wherein a second main group of lenses of the two non-overlapping groups of lenses comprises a lens closest to the second object;
   wherein the plurality of lenses is divided into the first and second main groups of lenses such that a refractive power of the first main lens group has a maximum negative value;
   wherein the plurality of lenses comprises one largest lens having a surface having a largest effective diameter out of all surface of lenses of the plurality of lenses, the one largest lens being contained in either the first or second main group of lenses,
   wherein each of the plurality of lenses which is a meniscus lens and which has a surface having an effective diameter that is at least 50% of the largest effective diameter and which is comprised in the either first or second main group of lenses containing the largest lens fulfils the following requirement:

$|r_1| \geq 140$ mm and $|r_2| \geq 140$ mm,

Wherein $r_1$ is a radius of curvature of a first optical surface of the meniscus lens, and $r_2$ is a radius of curvature of a second optical surface of the meniscus lens, and wherein each meniscus lens comprised in the either first or second main group of lenses further has an effective diameter which is less than 90% of the largest effective diameter.

* * * * *

UNITED STATES PATENT AND TRADEMARK OFFICE
CERTIFICATE OF CORRECTION

| | | |
|---|---|---|
| PATENT NO. | : 7,957,069 B2 | Page 1 of 1 |
| APPLICATION NO. | : 11/793678 | |
| DATED | : June 7, 2011 | |
| INVENTOR(S) | : Aurelian Dodoc and Wilhelm Ulrich | |

It is certified that error appears in the above-identified patent and that said Letters Patent is hereby corrected as shown below:

Sheet 2 of 3, Fig. 2, delete "SG1$_1$1" insert --SG$_1$1--;

Column 8, line 16, delete "lens-arrangements." insert --lens arrangements.--;

Column 18, line 38, Claim 6, delete "claim 4" insert --claim 4,--;

Column 18, line 48, Claim 8, after "claim 4" insert --,--.

Column 23, line 57, Claim 64, delete "h$_{fC}$" insert --h$_{fc}$--;

Column 23, line 62, Claim 64, delete "h$_{fC}$" insert --h$_{fc}$--;

Column 25, line 24-25, Claim 73, delete "non- overlapping" insert --non-overlapping--;

Column 26, line 22, Claim 76, delete "lens,wherein" insert --lens, wherein--;

Column 26, line 58, Claim 77, delete "Wherein" insert --wherein--;

Signed and Sealed this
Sixteenth Day of August, 2011

David J. Kappos
*Director of the United States Patent and Trademark Office*